United States Patent [19]

Baker

[11] Patent Number: 5,793,315
[45] Date of Patent: Aug. 11, 1998

[54] BIT-SERIAL DIGITAL EXPANDOR

[75] Inventor: James Clark Baker, Crystal Lake, Ill.

[73] Assignee: Motorola, Inc., Schaumburg, Ill.

[21] Appl. No.: 656,131

[22] Filed: May 31, 1996

[51] Int. Cl.[6] .................................... H03M 7/50
[52] U.S. Cl. .................................... 341/53; 333/14
[58] Field of Search .................. 341/50, 53, 94; 333/14; 364/574, 572

[56] References Cited

U.S. PATENT DOCUMENTS

| | | | |
|---|---|---|---|
| 4,087,754 | 5/1978 | Song | 325/38 B |
| 4,600,902 | 7/1986 | Lafferty | 333/14 |
| 4,799,242 | 1/1989 | Vermeulen | 375/122 |
| 4,891,837 | 1/1990 | Walker et al. | 379/390 |
| 5,274,578 | 12/1993 | Noeth et al. | 364/582 |

OTHER PUBLICATIONS

"An Integrated Expandor Circuit", by Pietro G. Erratico and Raimondo Caprio, IEEE Journal of Solid-State Circuits, vol. SC-11, No. 6, Dec. 1976, pp. 762-763.

"Compact NMOS Building Blocks and a Methodology for Dedicated Digital Filter Applications," by Johan K.J. Van Ginderdeuren, Hugo J. De Man, Nelson F. Goncalves, and Wilhelmus A.M. Van Noije, IEEE Journal of Solid-State Circuits, vol. SC-18, No. 3, Jun. 1983, pp. 306-316.

Primary Examiner—Marc S. Hoff
Assistant Examiner—Peguy Jean Pierre
Attorney, Agent, or Firm—Sylvia Chen

[57] ABSTRACT

A bit-serial digital expandor includes a bit-serial dual scaler block (340), a bit-serial rectifier block (320), a bit-serial lowpass wave digital filter block (350), a bit-serial scaler with overflow detection block (360), a bit-serial multiplier block (380), and a bit-serial scaler and clipper block (395). This bit-serial expandor can be used in an AMPS cellular telephone receiver to produce a receiver having a lower silicon area, gate count, and current drain compared to equivalent parallel architecture receivers.

20 Claims, 11 Drawing Sheets

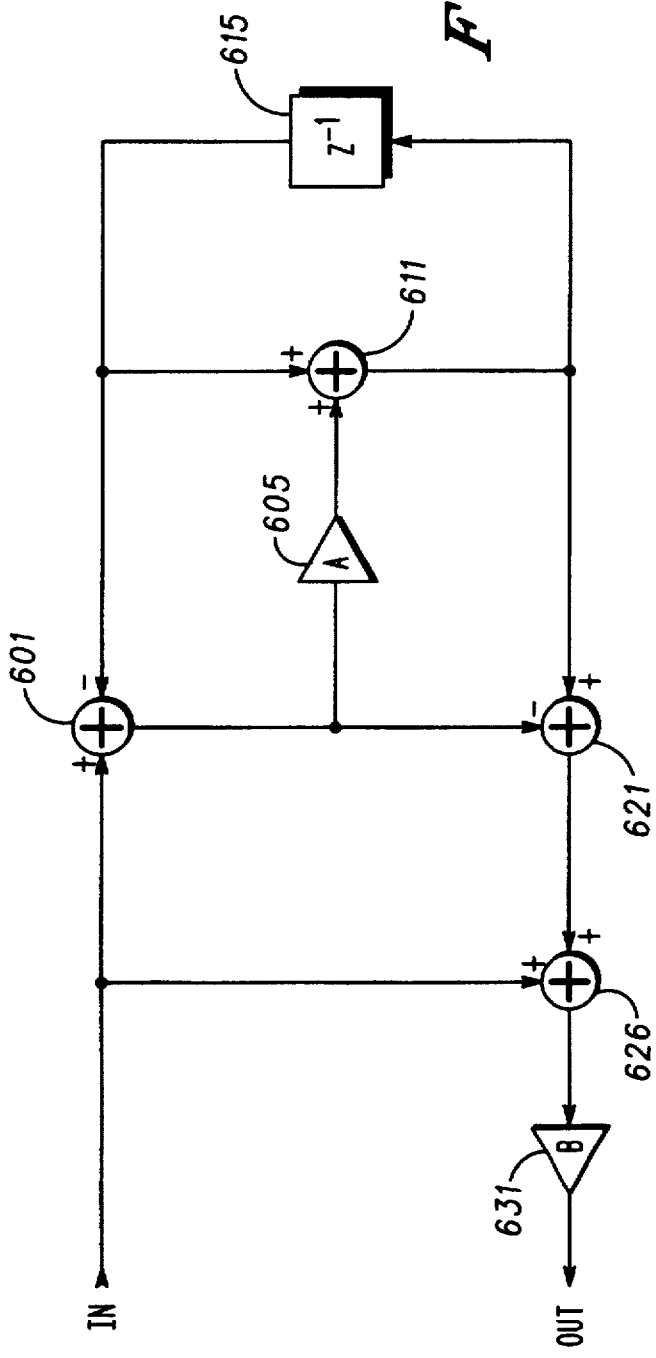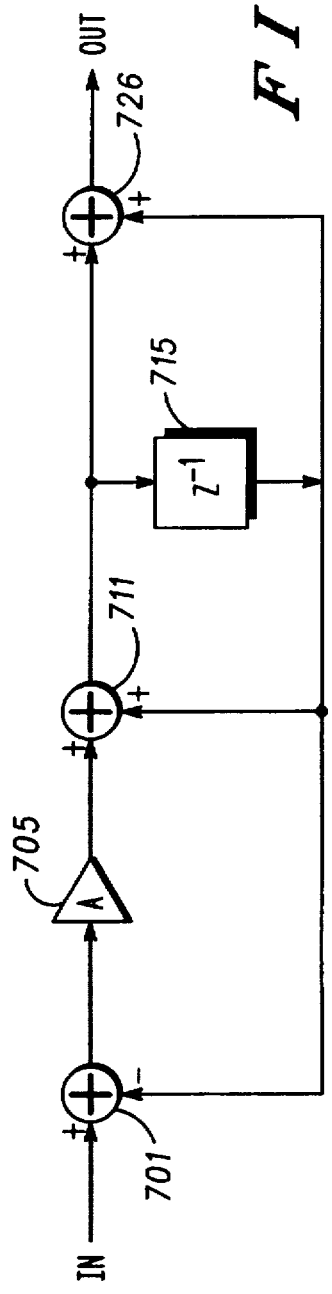
FIG. 6
FIG. 7

BIT-SERIAL DIGITAL EXPANDOR

CROSS-REFERENCE TO RELATED APPLICATIONS

This application is related to application Ser. No. 08/631,321 entitled "Method and Apparatus for Setting a Bit-Serial Filter to an All-Zero State" by James C. Baker and Denise Riemer (Attorney Docket No. CE01069R) filed Apr. 11, 1996, the specification of which is incorporated herein by reference. This application is also related to application Ser. No. 08/659,104 entitled "Bit-Serial Digital Compressor" by James C. Baker and John Oliver (Attorney Docket No. CE01239R) filed same date herewith, the specification of which is incorporated herein by reference.

FIELD OF THE INVENTION

This invention relates generally to digital signal processing, and more particularly to an expandor for a bit-serial digital signal processing circuit.

BACKGROUND OF THE INVENTION

Any digital filter can be built using bit-serial architecture, which reduces the gate count, silicon area, and current drain of the integrated circuit compared to an equivalent parallel filter design. Bit-serial filters use three basic building blocks: bit-serial adders, bit-serial scalers, and bit-serial delays. A bit-serial adder has only one full adder with two one-bit inputs and a single one-bit output. To achieve a dynamic range equivalent to that of a twenty-four bit parallel adder, the clock rate of the bit-serial adder is increased by a factor of twenty-four compared to the parallel adder. Generally speaking, $f_{bit}=B*f_{sample}$, where $f_{bit}$ is the bit-serial adder clock rate, B is the number of bits in a word, and $f_{sample}$ is the digital word sampling rate. Each bit in a word, from the least significant bit (LSB) to the most significant bit (MSB), appears on a serial bus for one bit time period, $1/f_{bit}$. Bit-serial scaling is achieved by shifting bits in a word to the right by N bits using a bit-repeater block, which results in a multiplication by $2^{-N}$. Summing bit-shifted versions of the input word results in a word multiplied by a selected coefficient. Bit-serial delays are generally implemented using a shift register that holds a bit for a predetermined number of bit time periods using flip-flops.

Bit-serial designs also require a controller. The bit-serial controller can be viewed as a shift register with a "one" signal of one bit time period circulating sequentially through the shift register. The length of the shift register is equal to the number of bits in a word, B. Signals from the bit-serial controller must be routed to adder blocks to coincide with the clock cycle that the first bit of a word, the LSB, appears at the input to a particular adder block. Signals from the bit-serial controller are also routed to bit-repeater blocks to specify a scaling coefficient for each particular bit-repeater block. Bit-serial architecture enables digital filters and other digital signal processing elements to have reduced gate count, silicon area, and current drain compared to parallel architecture digital filters. The trade-off for this reduced gate count is a higher clock speed.

The bit-serial controller and these three basic bit-serial building blocks, however, cannot be combined to create a bit-serial expandor. Compressing at a transmitter and expanding at a receiver (companding) is a widely-used technique for increasing the dynamic range of an analog signal and improving the quality of the signal to better withstand noise in a communication channel. Companding is specified in all analog cellular telephone systems and a number of other analog communication systems. Thus, there is a need for a bit-serial digital expandor in order to obtain the bit-serial architecture advantages of reduced gate count, silicon area, and current drain in an analog communication companding environment.

BRIEF DESCRIPTION OF THE DRAWINGS

FIG. 6 shows a signal flow diagram of a first-order lowpass wave digital filter.

FIG. 7 shows a signal flow diagram of a simplified first-order lowpass wave digital filter according to a preferred embodiment.

DETAILED DESCRIPTION OF THE INVENTION

A bit-serial digital expandor is implemented using the three bit-serial building blocks plus a bit-serial rectifier block, a bit-serial multiplier block, and bit-serial scaler blocks having overflow detection circuitry. Using this bit-serial expandor in an Advanced Mobile Phone System (AMPS) analog receiver for a portable radiotelephone or other communication system utilizing companding, results in reduced gate count, silicon area, and current drain compared to parallel expanders. This reduction in current drain is particularly advantageous in portable battery-operated devices and other environments where current drain is an important consideration.

Figure 1:
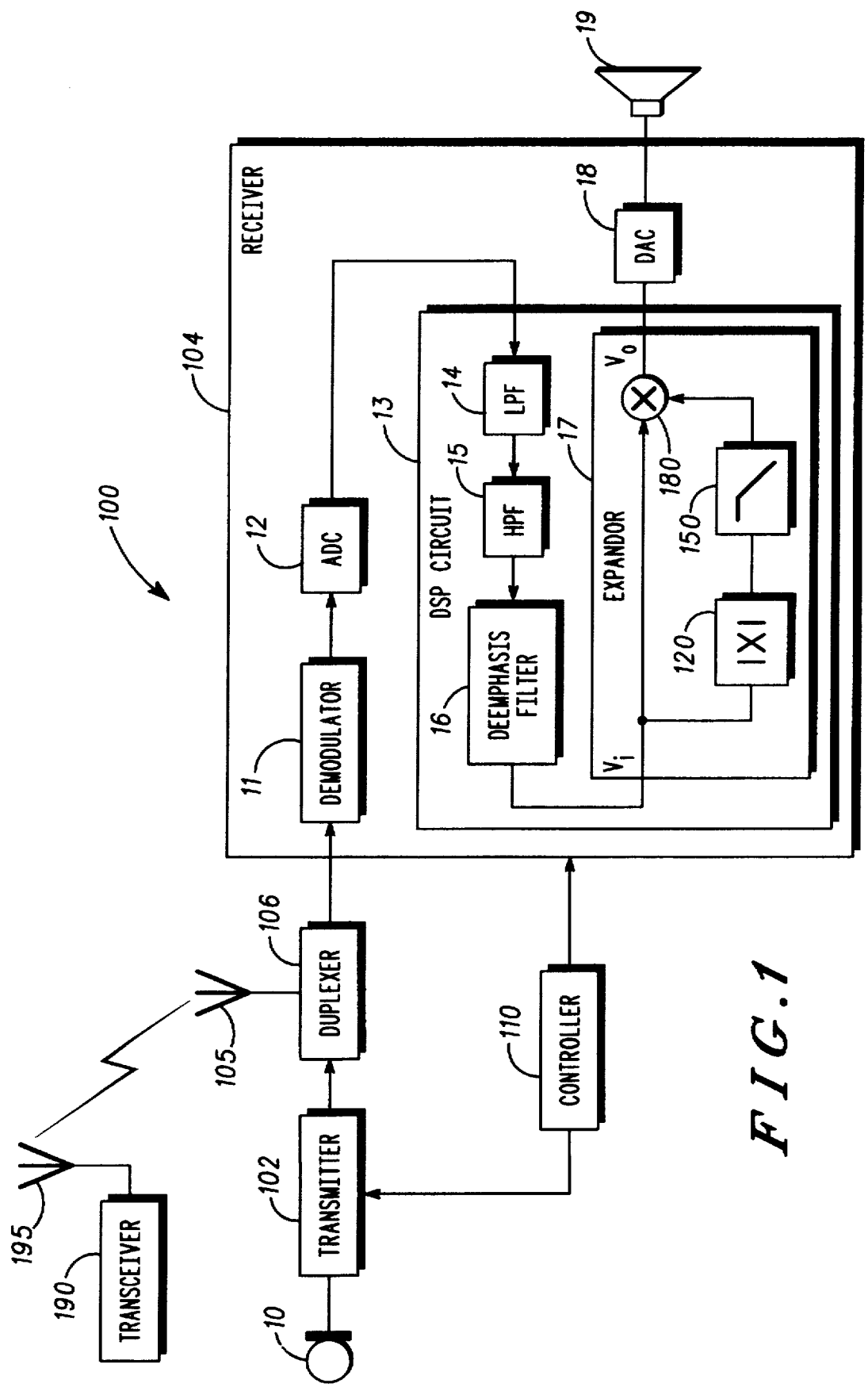
FIG. 1 shows a block diagram of a bit-serial expandor in a receiver of a communication device.

FIG. 1 shows a block diagram of a bit-serial expandor in a receiver 104 of a communication device 100. The illustrated communication device 100 having bit-serial expandor 17 is a radiotelephone, however, bit-serial expandor 17 can be employed in a MODEM (modulator/demodulator), two-way radio, land-line telephone, recording instrument, cellular telephone, cordless telephone, radio frequency receiver, or any other device using companding.

Transmitter 102 and receiver 104 in communication device 100 operate under the control of a controller 110, which can be implemented using a microprocessor, a digital signal processor, or the like. An antenna 105 is coupled to both transmitter 102 and receiver 104 via a duplexer 106. Antenna 105 emits signals generated by transmitter 102 from microphone 10 for transmission to a complementary communication device with a transceiver 190 and an antenna 195. Antenna 105 also detects radio frequency signals imparted to communication device 100 from the complementary communication device.

Although transmitter 102 can be implemented using any conventional circuitry, it is envisioned that transmitter 102 will employ a bit-serial compressor according to the disclosure in application Ser. No. 08/659,104 entitled "Bit-Serial Digital Compressor" by James C. Baker and John Oliver (Attorney Docket No. CE01239R).

In the receiver 104, demodulator 11 receives a modulated input signal from a complementary communication device through antenna 105 and duplexer 106. Demodulator 11 then produces a baseband analog output signal proportional to the modulating signal. Analog-to-digital converter (ADC) 12 converts the analog output signal from demodulator 11 to the digital domain. Digital signal processing (DSP) circuit 13 processes the digital signal using lowpass filter (LPF) 14, highpass filter (HPF) 15, deemphasis filter 16, and expandor 17. Preferably LPF 14 has a cut-off frequency of 3 kHz and HPF 15 has a cut-off frequency of 300 Hz to remove frequencies outside of the voice band from the signal. The output of the DSP circuit 13 is sent to a digital-to-analog converter (DAC) 18 and played through speaker 19.

The three major components of the bit-serial expandor 17 are a rectifier 120, a lowpass filter 150, and a multiplier 180. The expandor output $V_o$ is proportional to the product of the input $V_i$ and the root-mean-square (RMS) value of the input (i.e., $V_o = k * V_i * \sqrt{hd\ i}$).

Figure 2:
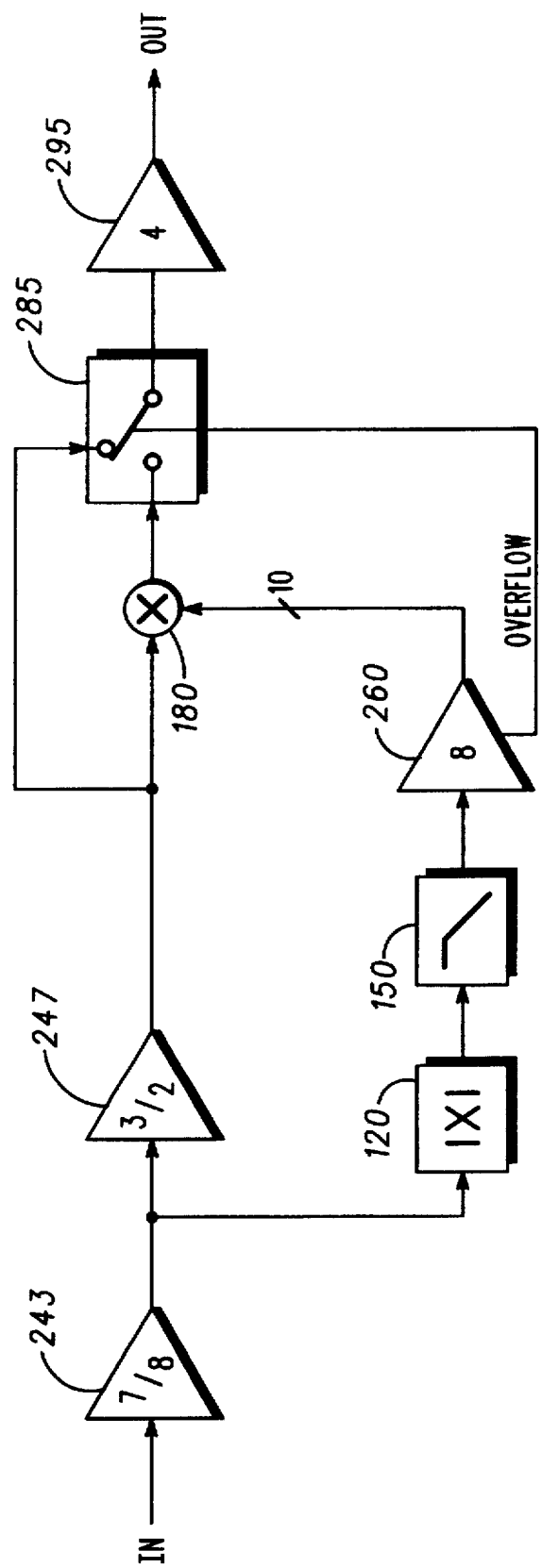
FIG. 2 shows a block diagram of a bit-serial expandor according to a preferred embodiment.

FIG. 2 shows a block diagram of a bit-serial expandor according to a preferred embodiment. After scaling an input signal using scaler 243, the gain branch of the expandor passes the signal through rectifier 120, lowpass filter 150 with a doubling gain, and scaler 260. In the upper branch of the expandor, scaler 247 further scales the signal from scaler 243.

The outputs of scaler 247 and scaler 260 are multiplied together using multiplier 180. Low-frequency high-deviation inputs, however, may overflow in the gain leg of the expandor circuit. If overflow is detected, the signal from scaler 247 bypasses the multiplier using multiplexer switch 285. The gain distribution has been chosen so that overflow cannot occur until the final scaler 260 has been reached. To increase dynamic range, a scaler 295 augments the signal from multiplexer switch 285. If overflow occurs in scaler 295, the output is capped at the most positive or most negative level, depending on the sign of the input.

In this example, the scaler coefficients provide an expandor that complies with AMPS specifications, which specifies that the deviation of a 1 kHz tone must be varied from the peak deviation of 12 kHz down to a 258 Hz deviation. This is a range of 33.3 dB at the expandor input and 66.6 dB at the output. Other considerations in choosing the gain distribution are the peak voltage out of the discriminator (12 kHz+2 kHz SAT+noise), the 6 dB/octave de-emphasis filter specified in the AMPS (e.g., a 500 Hz tone will be 6 dB larger than a 1 kHz tone), and the gain of the filters in the DSP circuit. Therefore, in this expandor, the coefficient for scaler 243 is seven-eighths, the coefficient for scaler 247 is three-halves, the coefficient for scaler 260 is eight, and the coefficient for scaler 295 is four.

Figure 3:
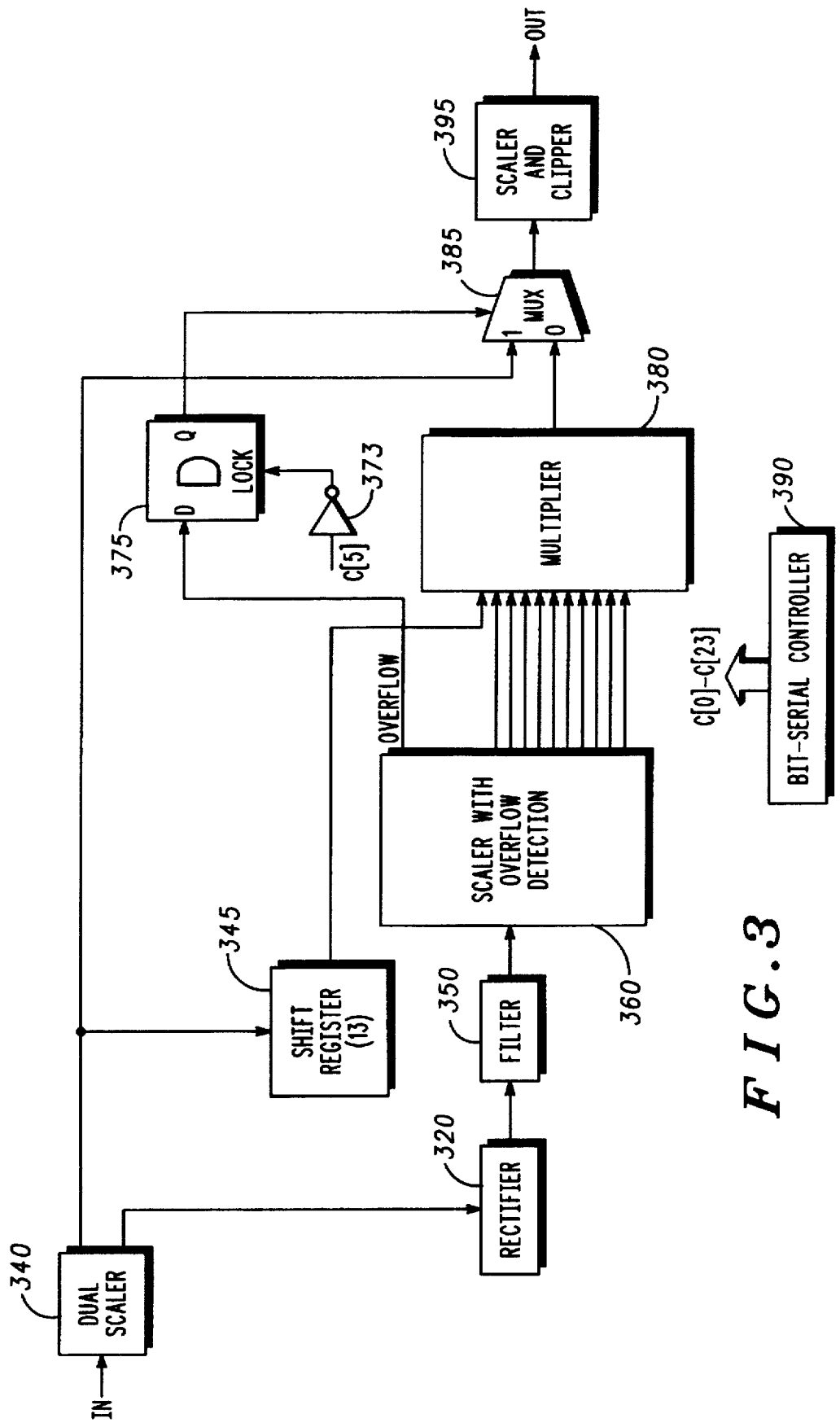
FIG. 3 shows an implementation of a bit-serial expandor according to a preferred embodiment.

FIG. 3 shows an implementation of a bit-serial expandor according to a preferred embodiment. This embodiment of the bit-serial digital expandor has been designed to mimic AMPS expanders in existing receivers. Thus, an input at or below a 1 kHz tone at 12 kHz deviation will produce a 2:1 gain. An input above a 1 kHz tone at 12 kHz deviation will produce a unitary multiplier gain (i.e., the input vs. output gain curve is 1:1) to reduce the dynamic range required at the output. Also in this implementation, a word is twenty-four bits long with the sign bit as the MSB. of course other length words can be used with other word configurations. Each sequential element in the expandor is clocked at the serial bit rate.

Dual scaler block 340 has a first output that provides a signal representing the input word scaled by 1.3125, which is equivalent to seven-eighths times three-halves, and drives the multiplier block 380 via shift register 345. A second output of dual scaler block 340 supplies the input word multiplied by a factor of seven-eighths, and drives the rectifier block 320, the lowpass filter block 350, and the scaler with overflow detection block 360. The ten most significant bits of each word at the output of scaler with overflow detection block 360 are used as a ten-bit multiplier gain term for multiplier block 380. If, however, the output of scaler block 360 has overflowed, the first signal from scaler block 340 bypasses the multiplier block 380 via D flip-flop 375 and multiplexer 385. Scaler and clipper block 395 scales the signal from multiplexer 385 for maximum dynamic range and clips any signal portions that may exceed the allowable dynamic range of the receiver. Each of these blocks will be described in more detail along with the other lower-level blocks required to implement this AMPS embodiment of a bit-serial digital expandor.

Bit-serial controller 390 uses control signals c[0]-c[23] to indicate when the LSB of a word enters an adder, to indicate scaling coefficients, and to synchronize and control the expandor circuit as a whole. The remaining blocks in FIG. 3 are shift register 345 and D flip-flop 375. Shift register 345 uses flip-flops to establish proper circuit timing. Shift register 345 contains thirteen flip-flops to insure that the LSB of a word from the first output of scaler block 340 enters the multiplier block 380 at the same time the gain term from scaler with overflow detection block 360 arrives. If desired, shift registers in the bit-serial expandor may be replaced with latches or other delay elements.

D flip-flop 375 delays an overflow detection signal by eleven bit time periods as directed by control signal c[5] from bit-serial controller 390. Control signal c[5] has a "one" only during the sixth bit time period of a twenty-four bit digital word; at other bit time periods the signal is a "zero." Control signal c[5] is inverted through inverter 373 to create a signal at the lock input of D flip-flop 375 that is "zero" only during the sixth bit time period of a twenty-four bit word. When a "zero" signal is at the lock input, D flip-flop 375 latches the signal at the D input. The inverted control signal at the lock input to D flip-flop 375 synchronizes the arrival of the overflow detection signal with the term that is invalid due to overflow.

Figure 4:
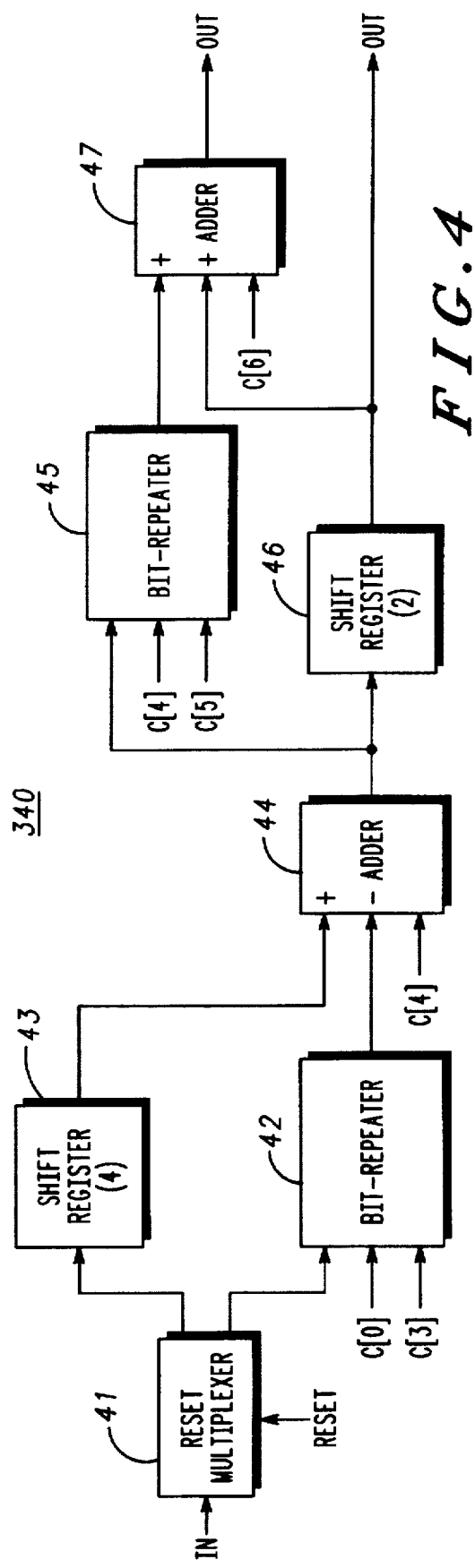
FIG. 4 shows an implementation of a bit-serial dual scaler for multiplication by two different factors according to a preferred embodiment.

FIG. 4 shows an implementation of a bit-serial dual scaler for multiplying an input by two different factors according to a preferred embodiment. Such a dual scaler can be used in dual scaler block 340 as shown in FIG. 3. A bit-serial reset multiplexer 41 allows the dual scaler to be reset without using resettable flip-flops according to the disclosure in application Ser. No. 08/631,321 entitled "Method and Apparatus for Setting a Bit-Serial Filter to an All-Zero State" by James C. Baker and Denise Riemer. Otherwise, the reset multiplexer does not affect the operation of the expandor. Control signal c[0] from bit-serial controller 390 (shown in FIG. 3) connected to bit-repeater block 42 is "one" for the first bit time period in a digital word, which is when the LSB of a word enters the block, and control signal c[3] is "one" three bit time periods later. These control signals indicate a scaling factor of $2^{-3}$, which is one-eighth. Meanwhile, the input signal is delayed by four bit time periods using shift register 43 so that the LSBs of the two input words to adder block 44 arrive simultaneously when control signal c[4] is high. The input signal scaled by one-eighth is subtracted from the input signal using adder block 44 to produce an output equal to the input scaled by seven-eighths.

The output of adder block 44 is scaled by one-half using bit-repeater block 45. The LSB arrival of each word is indicated using control signal c[4] from bit-serial controller 390 shown in FIG. 3, and the scaling coefficient, which is $2^{-1}$, is indicated using control signal c[5]. Meanwhile, shift register 46 delays the output of adder block 44 two bit time periods so that input words to adder block 47 arrive simultaneously when control signal c[6] is high. The output of shift register 46, representing the input word scaled by seven-eighths, is sent to rectifier block 320 shown in FIG. 3. The output of adder block 47 is equal to 1.3125 times the input word and goes to shift register 345 shown in FIG. 3 and multiplexer 385 shown in FIG. 3.

Figure 5:
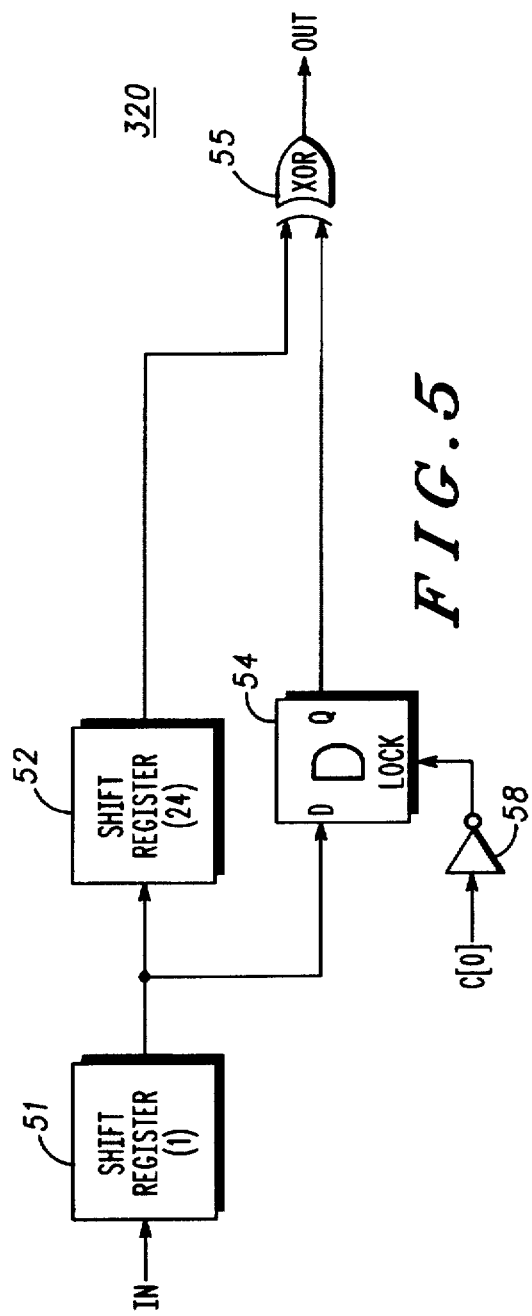
FIG. 5 shows an implementation of a bit-serial rectifier according to a preferred embodiment.

FIG. 5 shows an implementation of a bit-serial rectifier according to a preferred embodiment. This bit-serial rectifier can be used in rectifier block 320 shown in FIG. 3, which is connected to an output of the dual scaler block 340. Thus an input to the bit-serial rectifier shown in FIG. 5 can be the output of shift register 46 shown in FIG. 4. This bit-serial rectifier includes a first shift register 51 with a one bit time period delay and a second shift register 52 with a one word time period delay. Using these shift registers, the sign bit of a word is located at the input to shift register 52 when control signal c[0] is "one." Note that one-bit shift register 51 is not required, however, including shift register 51 contributes to easier control management by allowing control signal c[0] to indicate the presence of a sign bit in shift register 52 rather than control signal c[23].

When D flip-flop 54 receives a "one" control signal c[0] from the bit-serial controller 390 shown in FIG. 3 through inverter 58, which indicates that the MSB of a word has arrived at shift register 51, the sign bit is latched at an input to XOR logic gate 55 for one word time period. If the sign bit at the output of shift register 51 is "zero" at that time, the digital word is a positive number and the word is sent through XOR logic gate 55 unchanged. If the sign bit at the output of shift register 51 is "one," the word is a negative number. A negative number is inverted using ones-complement logic through XOR logic gate 55. To actually compute the absolute value of the negative number, one should be added to the LSB. To reduce the number of gates needed in the rectifier circuit, however, the step of adding one to the LSB has been omitted which does not affect the operation of the expandor.

FIG. 6 shows a signal flow diagram of a first-order lowpass wave digital filter. A first-order lowpass wave digital filter may be implemented in filter block 350 shown in FIG. 3. This filter is an infinite impulse response (IIR) filter with a single feedback loop through unit-delay block 615. An input signal enters adder 601. The output of adder 601 is sent to scaler 605 and multiplied by coefficient A. Coefficient A, which determines the filter cut-off frequency, is usually set to a number less than one. The output of scaler 605 is sent to adder 611. The output of adder 611 is delayed using unit-delay block 615. The output of unit-delay block 615 is negatively fed back to adder 601 and positively fed back to adder 611. The unit-delay block 615 represents a delay of one word cycle, which is twenty-four bit cycles in this example. The output of adder 611 is also sent to adder 621 which subtracts the output of adder 601. The output of adder 621 is summed with the input signal using adder 626. The output of adder 626 is multiplied by coefficient B using scaler 631 to produce an output signal. Generally, coefficient B is one-half to produce a unity gain wave digital filter.

FIG. 7 shows a signal flow diagram of a simplified first-order lowpass wave digital filter according to a preferred embodiment. Since filter block 350 is followed by scaler block 360 as shown in FIG. 3, the scaler 631 in the filter block 350 has been combined with scaler block 360 outside of the filter block 350 to reduce complexity. Note that this simplified filter has a doubling gain rather than a unity gain, because the final scaler 631 shown in FIG. 6 has been eliminated from the filter.

An input signal enters adder 701. The output of adder 701 is sent to scaler 705 and multiplied by coefficient A. Coefficient A, which determines the filter cut-off frequency, is usually set to a number less than one. In this example, coefficient A will be set to $2^{-10}$ plus $2^{-11}$, which produces a filter cutoff frequency of 8 Hz. The output of scaler 705 is sent to adder 711. The output of adder 711 is delayed using unit-delay block 715. The output of unit-delay block 715 is negatively fed back to adder 701, positively fed back to adder 711, and positively fed back to adder 726. The output of adder 711 is also sent to adder 726 which sums the output of unit-delay block 715 to produce an output signal.

Figure 8:
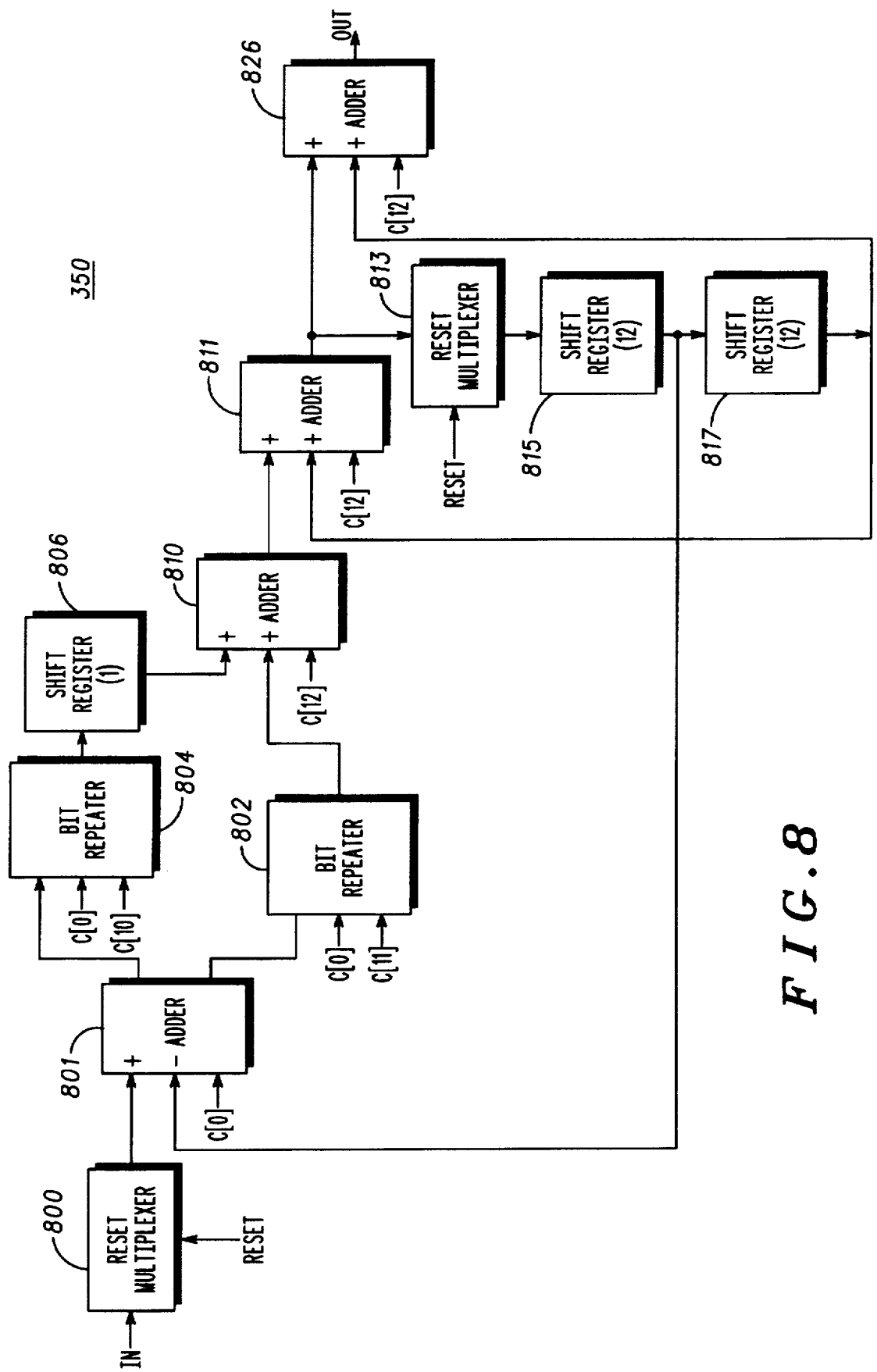
FIG. 8 shows a bit-serial implementation of a simplified first-order lowpass wave digital filter according to a preferred embodiment.

FIG. 8 shows a bit-serial implementation of a simplified first-order lowpass wave digital filter according to a preferred embodiment. This bit-serial filter can be used in filter block 350 shown in FIG. 3. The filter produces an output having an average level of the signal from rectifier block 320 shown in FIG. 3 over a predetermined time period, such as twenty milliseconds.

A combination of the three basic bit-serial building blocks is used to build a twenty-four bit IIR wave digital filter. Reset multiplexers 800, 813 allow the filter to be reset without the overhead of resettable flip-flops as described in application Ser. No. 08/631,321 entitled "Method and Apparatus for Setting a Bit-Serial Filter to an All-Zero State" by James C. Baker and Denise Riemer. An input signal enters adder block 801. The bit-serial controller 390 shown in FIG. 3 sends a "one" control signal c[0] as the LSB of each word enters the adder. Bit-repeater block 802 scales the output of adder block 801 by coefficient $2^{-11}$, through shifting each bit in an input word eleven bits to the right under the direction of control signal c[0] and c[11] from bit-serial controller 390 shown in FIG. 3. Meanwhile the output of adder block 801 also enters bit-repeater block 804, which scales an input word by $2^{-10}$ as instructed by signals c[0] and c[10]. The output of bit-repeater block 804 is delayed one bit time period by shift register 806 so that the addends arrive simultaneously at adder block 810 when control signal c[12] goes high. The output of adder block 810 is the signal from adder block 801 scaled by a coefficient A, equivalent to $2^{-10}$ plus $2^{-11}$, which produces a filter cutoff frequency of 8 Hz with a sampling rate of 32 kHz. The output of adder block 810 then enters adder block 811. Again, the bit-serial controller in FIG. 3 indicates using signal c[12] when the LSB of a word enters an adder.

The output of adder block 811 is delayed twelve times the bit time period ($12/f_{bit}$) using shift register 815. Because bit-repeater blocks 802, 804 and shift register 806 have already delayed a word by twelve bit time periods, only twelve additional bit time period delays are required to produce a unit delay of twenty-four bit time periods at the output of shift register 815. The output of shift register 815 is negatively fed back to adder block 801, positively fed back to adder block 811 through shift register 817, and positively fed back to adder block 826 through shift register 817. Shift register 817 delays a word by twelve times the bit time period ($12/f_{bit}$) so that the addends to adder blocks 811 and 826 arrive when control signal c[12] goes high. The filter output signal exits adder block 826.

Figure 9:
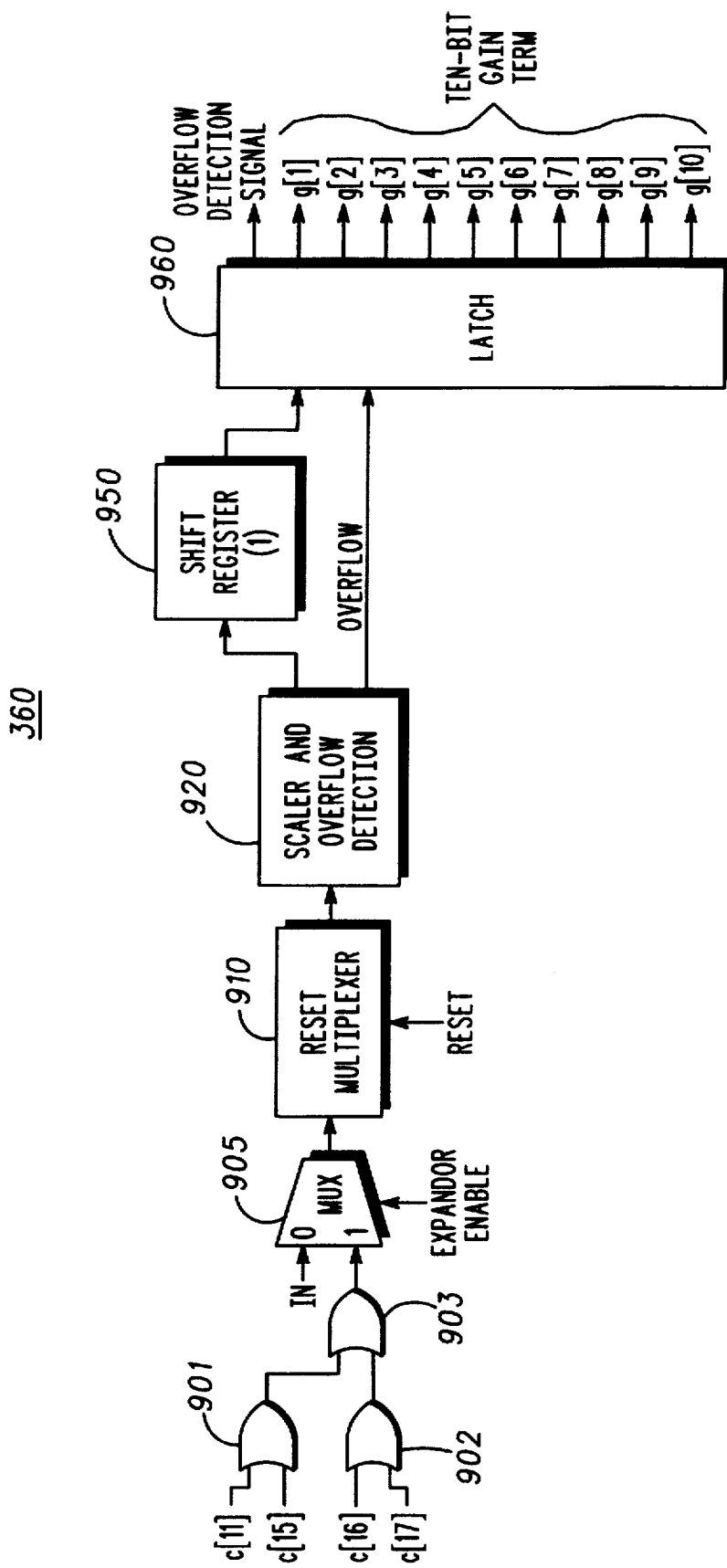
FIG. 9 shows an implementation of a bit-serial scaler and overflow detection block according to a preferred embodiment.

FIG. 9 shows an implementation of a bit-serial scaler and overflow detection block according to a preferred embodiment. This scaler and overflow detection block can be used in scaler block 360 shown in FIG. 3. The scaler portion implements a gain of eight with positive overflow detection. Then the ten most significant bits of the scaler output are latched and held for a complete word cycle to be used as the multiplier gain term g[1]–g[10]. If overflow is detected at the output of the scaler, the multiplier gain term is invalid and the output of scaler block 340 bypasses multiplier block 380 as shown in FIG. 3. Otherwise, the maximum multiplier gain is 1023/1024 as determined by the ten-bit multiplier gain term from the scaler block 360.

OR logic gates 901, 902, 903 cooperate with control signals c[11], c[15], c[16], c[17] to create a default word for use as a multiplier gain term that represents the level for a 1 kHz signal with nominal (2.9 kHz) deviation. Multiplexer 905 allows selection via the expandor enable signal between the default multiplier gain term and a gain term as computed from the expandor input signal. Reset multiplexer 910 allows the scaler block 920 to be reset without using resettable flip-flops as disclosed in application Ser. No. 08/631,321 entitled "Method and Apparatus for Setting a Bit-Serial Filter to an All-Zero State" by James C. Baker and Denise Riemer. One output of scaler block 920, the input word scaled by eight, is delayed for one bit time period by shift register 950 to synchronize this output with the other output of scaler block 920, which indicates whether overflow has occurred. Latch block 960 holds the ten most significant bits of the output to use as the multiplier gain term g[1]–g[10]. The scaler block 920 and the latch block 960 will be described in more detail below.

Figure 10:
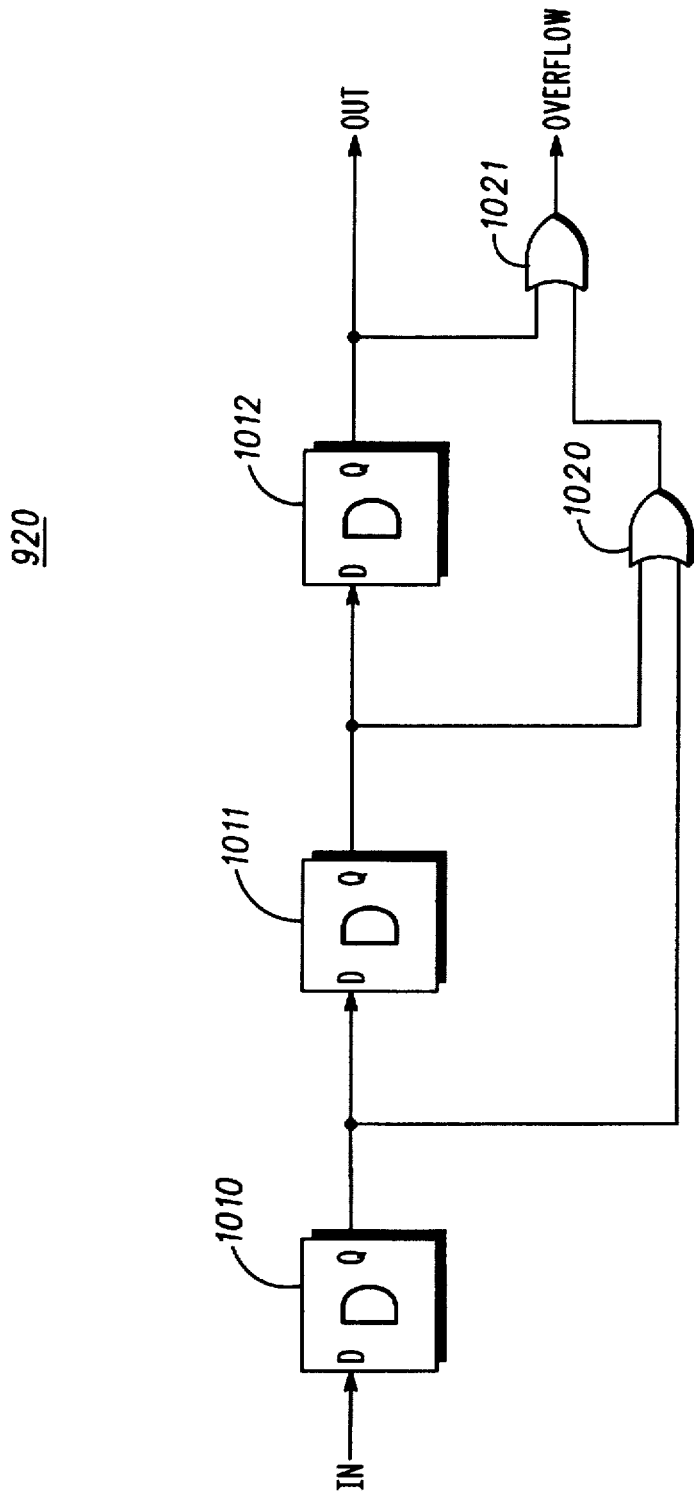
FIG. 10 shows details of a bit-serial scaler block with positive overflow detection circuitry according to a preferred embodiment.

FIG. 10 shows details of a bit-serial scaler block with positive overflow detection circuitry according to a preferred embodiment. This scaler can be used in scaler block 920 shown in FIG. 9. Because the input signal to this circuit is always positive, only positive overflow needs to be detected. The times-eight output is generated by shifting each bit in a word left three bit places using flip-flops 1010, 1011, 1012, which results in a multiplication by $2^3$. Overflow cannot be detected until the MSB of a word arrives. Thus, the appropriate time for overflow detection from this block is when control signal c[23] is "one." When the three most significant bits of the input word are in flip-flops 1010, 1011, 1012, OR logic gates 1020, 1021 indicate if a "one" is in the flip-flops. If a "one" is in one or more of these three flip-flops when signal c[23] is high, overflow is indicated and the overflow signal is sent to latch block 960 shown in FIG. 9.

Figure 11:
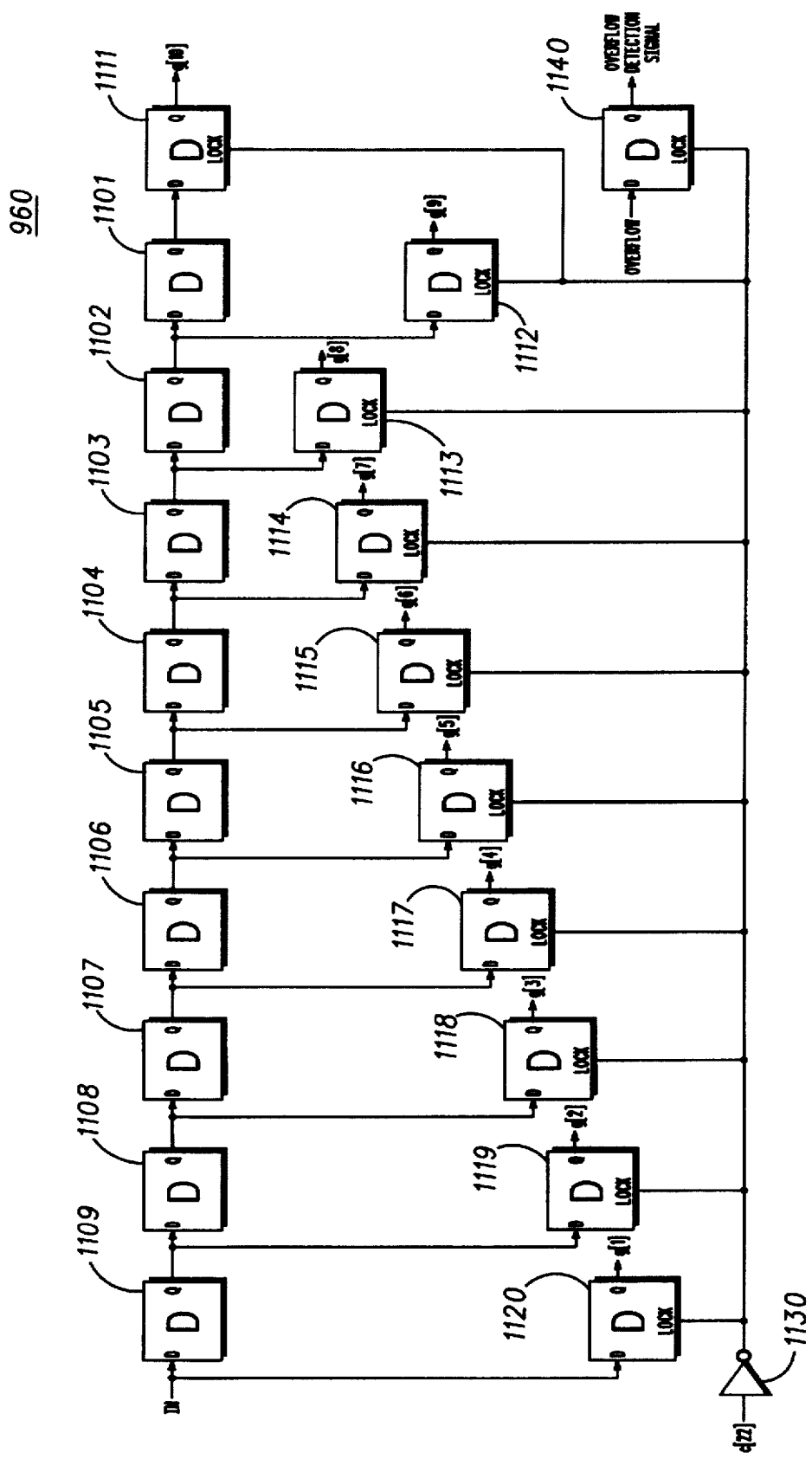
FIG. 11 shows details of a ten-bit latch according to a preferred embodiment.

FIG. 11 shows details of a ten-bit latch according to a preferred embodiment. This circuit can be used in latch block 960 shown in FIG. 9 to latch the ten most significant bits from the output of scaler block 920 and the overflow detection signal for one word cycle. When control signal c[22] is "one," the ten most significant bits from the output of scaler block 920 will be at flip-flops 1101–1109. When the next control signal c[23] goes to "one," these bits will be passed to flip-flops 1111–1120 and held in a parallel formation for one word cycle. Overflow detection signal is latched and held by flip-flop 1140.

Figure 12:
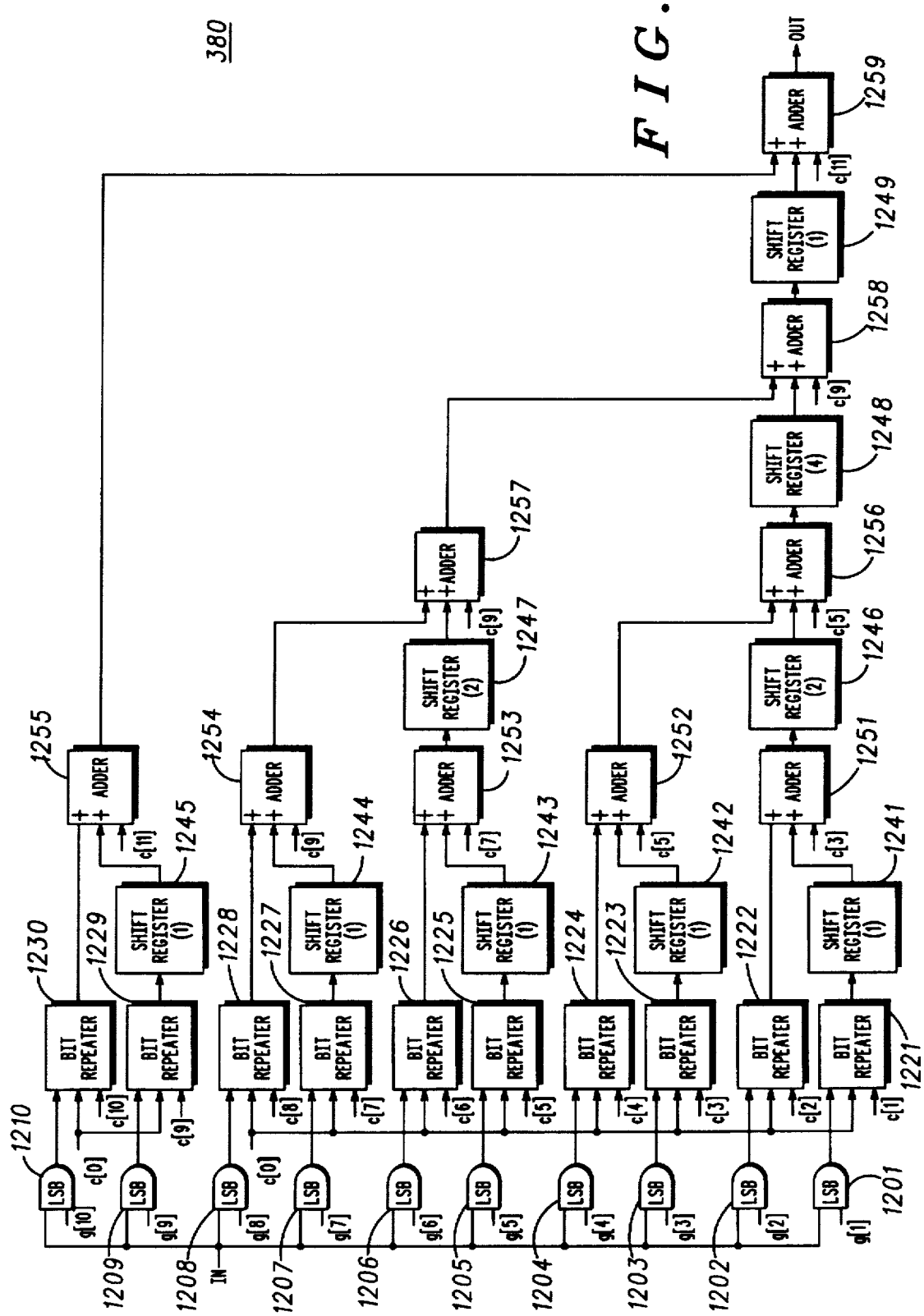
FIG. 12 shows details of a multiplier according to a preferred embodiment.

FIG. 12 shows details of a multiplier according to a preferred embodiment. This multiplier can be used in multiplier block 380 shown in FIG. 3. The ten-bit word from latch block 960 shown in FIG. 9 is sent in parallel formation to a first input of each AND logic gate 1201–1210 while a twenty-four bit word is sent in bit-serial formation to the other input of each AND logic gate. Ten bit repeaters 1221–1230 scale the bit-serial input by $2^{-1}$ through $2^{-10}$. Scaling is only performed on those bits that are set to "one" in the gain term and pass through the AND gates. Shift registers 1241–1249 synchronize the outputs of the bit repeaters so that the ten scaled versions can be accumulated at the output by adders 1251–1259 to produce a twenty-four bit output word.

Returning to FIG. 3, multiplexer 385 passes either the output of multiplier 380 or merely the first scaled output of dual scaler block 340 according to whether the overflow detection signal through D flip-flop 375 is high when control signal c[5] through inverter 373 sets the flip-flop. If overflow has occurred, the output of multiplier block 380 is invalid. Then, the first output of dual scaler block 340 is sent directly to scaler and clipper block 395. If overflow has not been detected, the output of multiplier block 380 is sent to scaler and clipper block 395.

Figure 13:
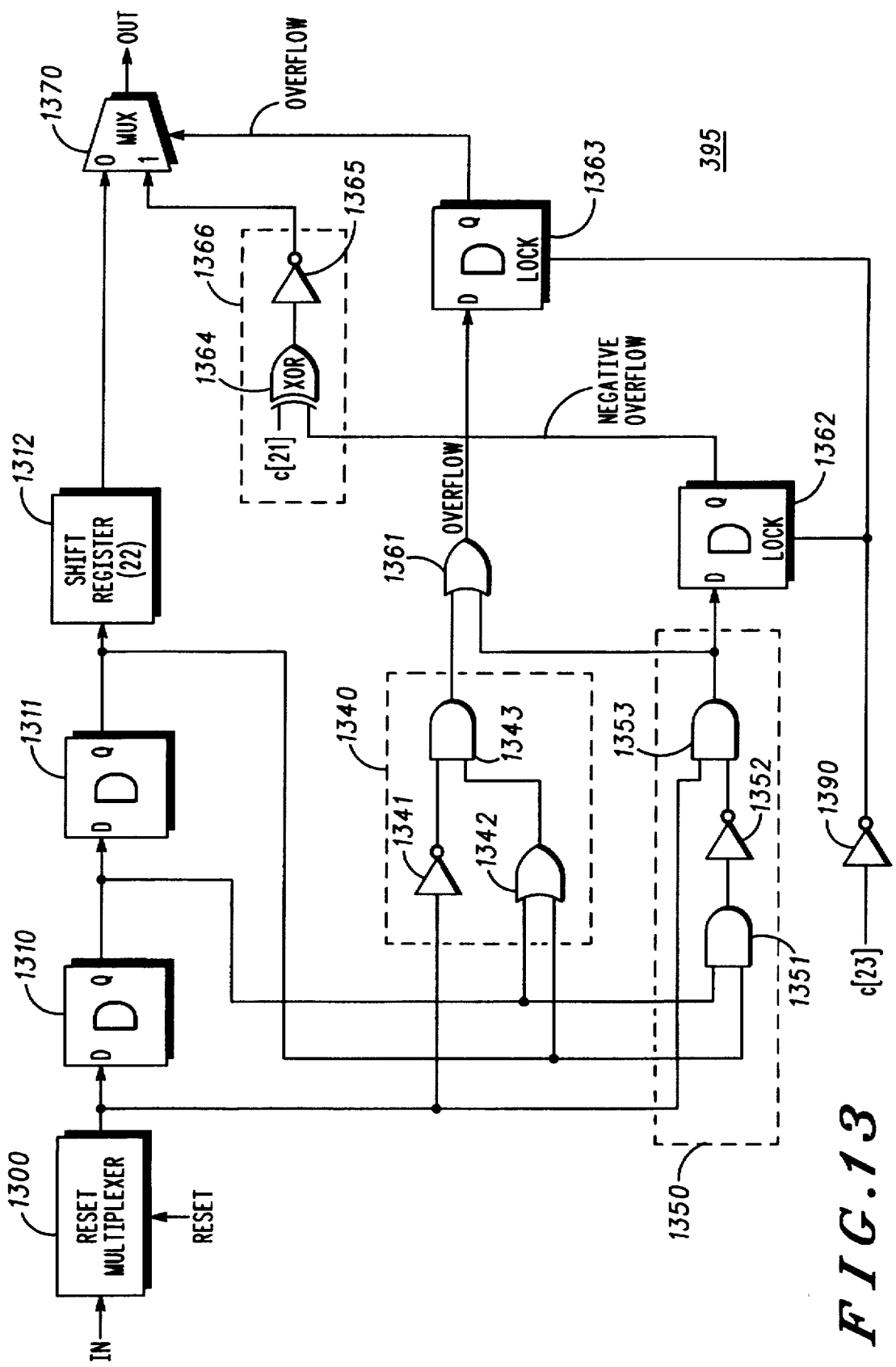
FIG. 13 shows an implementation of a bit-serial scaling and clipping circuit according to a preferred embodiment.

FIG. 13 shows an implementation of a bit-serial scaling and clipping circuit according to a preferred embodiment. This scaling and clipping circuit can be used in scaler and clipper block 395 shown in FIG. 3. Preferably, the output of multiplexer 385 is scaled to increase the dynamic range of the signal. The scaled signal, however, may exceed the dynamic range of the receiver, thus clipping is conducted. Reset multiplexer 1300 can set the circuit to an all-zero state without using resettable flip-flops as shown in application Ser. No. 08/631,321 entitled "Method and Apparatus for Setting a Bit-Serial Filter to an All-Zero State" by James C. Baker and Denise Riemer. Flip-flops 1310, 1311 shift each bit in a word two bits to the left to effect a scale-by-four function. When control signal c[23] is high, the sign bit is at the input to flip-flop 1310 and the next two MSBs are at the outputs to flip-flops 1310, 1311. These three bits are sent to positive overflow detection circuit 1340 and negative overflow detection circuit 1350. Logic gates 1341–1343 determine if positive overflow has occurred, while logic gates 1351–1353 determine if negative overflow has occurred. OR logic gate 1361 and flip-flop 1363 indicate whether overflow has occurred, while flip-flop 1362 indicates specifically whether negative overflow has occurred. When control signal c[23] is "one," the flip-flops latch the overflow detection signal.

If overflow has occurred, multiplexer 1370 receives a high overflow detection signal and will pass either the maximum positive value digital word or the maximum negative value digital word depending on whether the overflow is negative or positive. If the overflow is negative, maximum value word generator 1366 having XOR logic gate 1364 and inverter 1365 will pass the lowest possible word. If the overflow is positive, maximum value word generator 1366 will pass the highest possible word. The lowest and highest possible words are generated using control signal c[21] and the negative overflow signal from negative overflow detection circuit 1350 as inputs to XOR logic gate 1364. If there is no overflow, the signal from shift register 1312 is passed through multiplexer 1370 undisturbed. The output of multiplexer 1370 is preferably the output of the bit-serial digital expandor.

Thus, a bit-serial digital expandor can be used to reduce gate count, silicon area, and current drain in a circuit. While specific components and functions of the bit-serial digital expandor are described above, fewer or additional functions could be employed by one skilled in the art within the true spirit and scope of the present invention. The invention should be limited only by the appended claims.

I claim:

1. A bit-serial digital expandor comprising:

a signal input;

a bit-serial rectifier connected to the signal input, wherein the bit-serial rectifier comprises a flip-flop connected to a logic gate in a bit-serial architecture;

a bit-serial filter connected to an output of the bit-serial rectifier; and a bit-serial multiplier connected to the signal input and an output of the bit-serial filter.

2. A bit-serial digital expandor according to claim 1 further comprising:

a bit-serial scaling and clipping circuit connected to an output of the bit-serial multiplier.

3. A bit-serial digital expandor according to claim 2 wherein the bit-serial scaling and clipping circuit comprises:

a scaling flip-flop for scaling an input signal connected to an input of the bit-serial scaling and clipping circuit; and a positive overflow detection circuit connected to the scaling flip-flop.

4. A bit-serial digital expandor according to claim 2 wherein the bit-serial scaling and clipping circuit comprises:

a scaling flip-flop for scaling an input signal connected to an input of the bit-serial scaling and clipping circuit; and a negative overflow detection circuit connected to the scaling flip-flop.

5. A bit-serial digital expandor according to claim 2 wherein the bit-serial scaling and clipping circuit comprises:

a scaling flip-flop for scaling an input signal connected to an input of the bit-serial scaling and clipping circuit;

a positive overflow detection circuit connected to the scaling flip-flop; and a negative overflow detection circuit connected to the scaling flip-flop.

6. A bit-serial digital expandor comprising:

a signal input;

a bit-serial rectifier connected to the signal input;

a bit-serial filter connected to an output of the bit-serial rectifier;

a bit-serial multiplier connected to the signal input and an output of the bit-serial filter; and a bit-serial scaling and clipping circuit connected to an output of the bit-serial multiplier, wherein the bit-serial scaling and clipping circuit comprises a flip-flop for scaling an input signal connected to an input of the bit-serial scaling and clipping circuit, a positive overflow detection circuit connected to the flip-flop, and a switch having a first input connected to a maximum positive value digital word generator, a second input connected to the flip-flop, and a control input connected to the positive overflow detection circuit for selectively connecting the maximum positive value digital word generator to an output of the bit-serial scaling and clipping circuit if a positive overflow is detected by the positive overflow detection circuit and for selectively connecting the flip-flop to the output of the bit-serial scaling and clipping circuit if a positive overflow is not detected by the positive overflow detection circuit.

7. A bit-serial digital expandor comprising:

a signal input;

a bit-serial rectifier connected to the signal input;

a bit-serial filter connected to an output of the bit-serial rectifier;

a bit-serial multiplier connected to the signal input and an output of the bit-serial filter; and a bit-serial scaling and clipping circuit connected to an output of the bit-serial multiplier, wherein the bit-serial scaling and clipping circuit comprises a flip-flop for scaling an input signal connected to an input of the bit-serial scaling and clipping circuit, a negative overflow detection circuit connected to the flip-flop, and a switch having a first input connected to a maximum negative value digital word generator, a second input connected to the flip-flop, and a control input connected to the negative overflow detection circuit for selectively connecting the maximum negative value digital word generator to an output of the bit-serial scaling and clipping circuit if a negative overflow is detected by the negative overflow detection circuit and for selectively connecting the flip-flop to the output of the bit-serial scaling and clipping circuit if a negative overflow is not detected by the negative overflow detection circuit.

8. A bit-serial digital expandor comprising:

a signal input;

a bit-serial rectifier connected to the signal input;

a bit-serial filter connected to an output of the bit-serial rectifier;

a bit-serial multiplier connected to the signal input and an output of the bit-serial filter; and a bit-serial scaling and clipping circuit connected to an output of the bit-serial multiplier, wherein the bit-serial scaling and clipping circuit comprises a flip-flop for scaling an input signal connected to an input of the bit-serial scaling and clipping circuit, a positive overflow detection circuit connected to the flip-flop, a negative overflow detection circuit connected to the flip-flop, and a switch having a first input connected to a maximum value digital word generator, a second input connected to the flip-flop, and a control input connected to the positive overflow detection circuit and the negative overflow detection circuit for connecting a maximum positive value digital word from the maximum value digital word generator to an output of the bit-serial scaling and clipping circuit if a positive overflow is detected by the positive overflow detection circuit, for connecting a maximum negative value digital word from the maximum value digital word generator to the output of the bit-serial scaling and clipping circuit if a negative overflow is detected by the negative overflow detection circuit, and for connecting the flip-flop to the output of the bit-serial scaling and clipping circuit if neither a positive overflow is detected by the positive overflow detection circuit nor a negative overflow is detected by the negative overflow detection circuit.

9. A bit-serial digital expandor comprising:

a signal input;

a bit-serial dual scaler connected to the signal input;

a bit-serial rectifier connected to a first output of the bit-serial dual scaler, wherein the bit-serial rectifier comprises a flip-flop connected to a logic gate in a bit-serial architecture;

a bit-serial filter connected to an output of the bit-serial rectifier; and a bit-serial multiplier connected to a second output of the bit-serial dual scaler and connected to an output of the bit-serial filter.

10. A bit-serial digital expandor according to claim 9 further comprising:

a bit-serial scaler with positive overflow detection circuitry connected between the output of the bit-serial filter and the bit-serial multiplier.

11. A bit-serial digital expandor according to claim 10 wherein the bit-serial scaler with positive overflow detection circuitry comprises:

at least one scaling flip-flop for scaling an input signal; and a positive overflow detection circuit connected to an output of each at least one scaling flip-flop.

12. A bit-serial digital expandor according to claim 9 wherein the bit-serial filter is a wave digital filter.

13. A bit-serial digital expandor according to claim 9 wherein the bit-serial filter is a lowpass filter.

14. A bit-serial digital expandor comprising:

a signal input;

a bit-serial dual scaler connected to the signal input;

a bit-serial rectifier connected to a first output of the bit-serial dual scaler;

a bit-serial filter connected to an output of the bit-serial rectifier;

a bit-serial multiplier connected to a second output of the bit-serial dual scaler and connected to an output of the bit-serial filter; and a switch having a first input connected to an output of the bit-serial multiplier and a second input connected to the first output of the bit-serial dual scaler.

15. A bit-serial digital expandor according to claim 14 further comprising:

a bit-serial scaling and clipping circuit connected to an output of the switch.

16. A bit-serial digital expandor comprising:

a signal input;

a bit-serial dual scaler connected to the signal input, wherein the bit-serial dual scaler comprises a signal input, a first bit-repeater connected to the signal input, and a second bit-repeater connected to an output of the first bit-repeater;

a bit-serial rectifier connected to a first output of the bit-serial dual scaler;

a bit-serial filter connected to an output of the bit-serial rectifier; and a bit-serial multiplier connected to a second output of the bit-serial dual scaler and connected to an output of the bit-serial filter.

17. A bit-serial digital expandor comprising:

a signal input;

a bit-serial dual scaler connected to the signal input;

a bit-serial rectifier connected to a first output of the bit-serial dual scaler, wherein the bit-serial rectifier comprises a shift register having a one word time period delay, a flip-flop connected to an input of the shift register, a logic gate connected to the shift register and the flip-flop, wherein the flip-flop latches a sign bit of a word when the sign bit of the word is located at an input to the shift register;

a bit-serial filter connected to an output of the bit-serial rectifier; and a bit-serial multiplier connected to a second output of the bit-serial dual scaler and connected to an output of the bit-serial filter.

18. A bit-serial digital expandor comprising:

a signal input;

a bit-serial dual scaler connected to the signal input;

a bit-serial rectifier connected to a first output of the bit-serial dual scaler;

a bit-serial filter connected to an output of the bit-serial rectifier; and a bit-serial multiplier connected to a second output of the bit-serial dual scaler and connected to an output of the bit-serial filter, wherein the bit-serial multiplier comprises a first logic gate having a bit-serial input and a bit-parallel input, a second logic gate having a bit-serial input and a bit-parallel input, a first bit repeater connected to an output of the first logic gate, a shift register connected to an output of the first bit repeater, a second bit repeater connected to an output of the second logic gate, and an adder connected to an output of the first bit repeater and the shift register.

19. A receiver comprising:

a bit-serial digital expandor having a bit-serial rectifier connected to the signal input, wherein the bit-serial rectifier comprises a flip-flop connected to a logic gate in a bit-serial architecture;

a bit-serial filter connected to an output of the bit-serial rectifier; and a bit-serial multiplier connected to the signal input and connected to an output of the bit-serial filter.

20. A portable radiotelephone comprising:

a bit-serial digital expandor having a bit-serial rectifier connected to a signal input, wherein the bit-serial rectifier comprises a flip-flop connected to a logic gate in a bit-serial architecture;

a bit-serial filter connected to an output of the bit-serial rectifier; and a bit-serial multiplier connected to the signal input and an output of the bit-serial filter.

\* \* \* \* \*